United States Patent
Lan et al.

(10) Patent No.: US 10,693,027 B2
(45) Date of Patent: Jun. 23, 2020

(54) METHOD FOR INTERCONNECTING SOLAR CELLS

(71) Applicant: ALTA DEVICES, Inc., Sunnyvale, CA (US)

(72) Inventors: Liguang Lan, Sunnyvale, CA (US); Linlin Yang, Sunnyvale, CA (US); Jian Ding, San Jose, CA (US)

(73) Assignee: ALTA DEVICES, INC., Sunnyvale, CA (US)

( * ) Notice: Subject to any disclaimer, the term of this patent is extended or adjusted under 35 U.S.C. 154(b) by 39 days.

(21) Appl. No.: 14/994,889

(22) Filed: Jan. 13, 2016

(65) Prior Publication Data
US 2017/0200846 A1 Jul. 13, 2017

(51) Int. Cl.
*H01L 31/044* (2014.01)
*H01L 31/05* (2014.01)
*H01L 31/0224* (2006.01)
*H01L 27/142* (2014.01)

(52) U.S. Cl.
CPC ...... *H01L 31/0516* (2013.01); *H01L 27/1421* (2013.01); *H01L 31/02245* (2013.01); *H01L 31/022441* (2013.01); *Y02E 10/50* (2013.01)

(58) Field of Classification Search
CPC ....... H01L 31/00–078; Y02E 10/50–60; H02S 40/00–44
USPC .................................. 136/243–265
See application file for complete search history.

(56) References Cited

U.S. PATENT DOCUMENTS

| | | | | |
|---|---|---|---|---|
| 2001/0054436 A1* | 12/2001 | Mukai | ............. | H01L 31/022425 136/256 |
| 2002/0000242 A1* | 1/2002 | Matushiita | ...... | H01L 31/022425 136/244 |
| 2006/0207645 A1* | 9/2006 | Wada | .................... | H01L 31/048 136/244 |

(Continued)

FOREIGN PATENT DOCUMENTS

| | | |
|---|---|---|
| JP | 2013-093390 A | 5/2013 |
| WO | WO 2008/036769 A2 | 3/2008 |
| WO | WO 2014/184856 A1 | 11/2014 |

OTHER PUBLICATIONS

International Search Report and Written Opinion issued in International Patent Application No. PCT/US2017/013230, dated Mar. 9, 2017 (14 pages).

*Primary Examiner* — Bach T Dinh
(74) *Attorney, Agent, or Firm* — Arent Fox, LLP

(57) ABSTRACT

A photovoltaic module comprises a back substrate having a plurality of conductive interconnects on top thereof. A conductive interconnect includes a first contact region and a second contact region. The photovoltaic module further comprises a plurality of photovoltaic cells comprising front electrodes disposed on a front surface of a photovoltaic layer on top of back electrodes on top of a support substrate. A plurality of back vias extending through the support substrate of a first cell form an electrical contact between the back electrodes and the second contact region, and a plurality of front vias extending through the support substrate, the back electrodes and the photovoltaic layer of a second cell form an electrical contact between the front electrodes and the first contact region, and is insulated from an electrical contact with the back electrodes and a P side of the photovoltaic layer.

18 Claims, 10 Drawing Sheets

(56) References Cited

U.S. PATENT DOCUMENTS

| | | | |
|---|---|---|---|
| 2008/0115821 A1* | 5/2008 | Xu | H01L 31/022425 136/244 |
| 2009/0050190 A1* | 2/2009 | Nishida | H01L 31/022433 136/244 |
| 2009/0183759 A1* | 7/2009 | Hishida | H01L 31/02245 136/244 |
| 2009/0301543 A1* | 12/2009 | Reddy | H01L 31/0465 136/244 |
| 2012/0048355 A1 | 3/2012 | Hsieh et al. | |
| 2014/0273334 A1* | 9/2014 | Christensen | H01L 31/022425 438/94 |
| 2014/0318602 A1* | 10/2014 | Black | H01L 31/02013 136/251 |
| 2014/0360554 A1* | 12/2014 | Feist | H01L 31/0463 136/245 |
| 2015/0020881 A1 | 1/2015 | Cruz et al. | |
| 2015/0090317 A1* | 4/2015 | Tokuoka | H01L 31/0465 136/249 |

\* cited by examiner

METHOD FOR INTERCONNECTING SOLAR CELLS

TECHNICAL FIELD

The present invention relates generally to photovoltaic cells and more particularly to interconnecting photovoltaic cells into photovoltaic modules.

BACKGROUND

Solar cells have become a widely used technology to convert light energy to electrical energy. An array of solar cells can be interconnected and assembled into a solar module or a solar panel to achieve aggregated current and voltage generated by the individual solar cells. One prevalent approach of interconnecting solar cells is to overlap two solar cells to realize electrical connection, e.g., an upper cell and a lower cell. In a typical solar cell configuration, the back electrode of an upper cell is electrically connected with the front electrode of a lower cell. In this manner, multiple solar cells are interconnected in series.

More specifically, metal contacts disposed on the front and the back sides of a photovoltaic (PV) layer of a solar cell form the front electrode and the back electrode, respectively. The back electrode is disposed between the PV layer and a non-conductive substrate layer. Thus, when two cells partially overlap each other, the non-conductive substrate is disposed between the back electrode of the upper cell and the front electrode of the lower cell. To provide electrical continuity between the two overlapping cells, vias are made on the substrate and filled with a conductive material, which is commonly in the form of resin, paste or ink during the filling process and hardens after a cure process.

In practice, a back via is usually subject to overfill with the conductive material to prevent the formation of a void inside the via which can potentially lead to a failed contact. However, filling a back via with excess conductive material tends to cause an uncontrolled lateral overflow (or smear) of the conductive material from the via, especially when the two solar cells are stacked and pressed together for integration. The conductive material overflow can undesirably reach and bridge the front and back electrodes of another solar cell (e.g., the lower solar cell) and cause short circuit.

Conventionally, to solve this issue, an insulating material is deposited around the perimeter of the solar cells followed by a cure procedure. An insulating adhesive can be applied such that to both bond the overlapping solar cells for the mechanical integrity of the solar module, and to prevent the conductive material overflow described above from forming short circuit.

Further, series of the solar cells of a solar module needs protection from the mismatch in the properties of the interconnected solar cells such that energy generating capability of the interconnected solar cells will not be dissipated. When solar cells are arranged in an overlapping structure, one way is to connect a diode, also referred to as bypass diode, to a group of solar cells of the solar module by disposing a ribbon conductor at a position corresponding to the number of solar cells. The ribbon conductor provides an electrical contact between a contact terminal of the diode and a contact terminal of the series of the solar cells to bypass.

Therefore, there exists a need to eliminate the overlapping between solar cells and the associated insulation of the individual solar cells, to reduce the overall thickness of the solar panel caused by the overlapping of solar cells and the associated insulation, to conveniently connect diodes with series of solar cells of a solar module.

SUMMARY OF THE INVENTION

In one exemplary embodiment in accordance with the present disclosure, a photovoltaic cell includes a photovoltaic layer configured to convert light energy to electrical energy, a front conductive layer disposed on a first side of the photovoltaic layer and a back conductive layer disposed on a second side of the photovoltaic layer. The second side is opposite to the first side, and the front conductive layer and the back conductive layer are configured to conduct electrical current originated from the photovoltaic layer to an external circuitry. The photovoltaic cell further includes a support substrate layer disposed under the back conductive layer, a back via extends through the support substrate, dispensed with a conductive material forming an electrical contact with the back conductive layer, and a front via extends through the support substrate layer, the back conductive layer and the photovoltaic layer, dispensed with a conductive material and a insulation material. The insulation material insulates the conductive material from an electrical contact with the back conductive layer and a P side of the photovoltaic layer, the conductive material forms an electrical contact with the front conductive layer.

In another exemplary embodiment in accordance with the present disclosure, a photovoltaic module includes a back substrate and a plurality of conductive interconnects disposed on top of a surface of the back substrate. A conductive interconnect has a first contact region and a second contact region. The photovoltaic module further includes a plurality of photovoltaic cells electrically coupled to each other on top of the surface of the back substrate. A photovoltaic cell comprises front electrodes disposed on a front surface of a photovoltaic layer on top of back electrodes on top of a support substrate. A photovoltaic cell also comprise a plurality of back vias extend through the support substrate forming an electrical contact with the back electrodes, and a plurality of front vias extend through the support substrate, the back electrodes and the photovoltaic layer forming an electrical contact with the front electrodes and insulated from an electrical contact with the back electrodes and a P side of the photovoltaic layer. The first contact region of a conductive interconnect of plurality of conductive interconnects is electrically coupled to the plurality of front vias of a first photovoltaic cell of the plurality of photovoltaic cells, and the second contact region of the conductive interconnect is electrically coupled to the plurality of back vias of a second photovoltaic cell of the plurality of photovoltaic cells.

In yet another exemplary embodiment in accordance with the present disclosure, a method for interconnecting photovoltaic cells is provided. A photovoltaic cell includes front electrodes disposed on a photovoltaic layer disposed on back electrodes on a support substrate, and a plurality of back vias extending through the support substrate forming an electrical contact with the back electrodes, and a plurality of front vias extending through the support substrate, the back electrodes and the photovoltaic layer forming an electrical contact with the front electrodes and insulated from an electrical contact with the back electrodes and a P side of the photovoltaic layer. The method includes the step of attaching a conductive interconnect on a surface of a back substrate, the conductive interconnect having a first contact region and a second contact region. The method also includes the step of attaching a first photovoltaic cell to overlay with the first contact region of the conductive interconnect, where a plurality of front vias of the first photovoltaic cell are electrically coupled between the first contact region of the conductive interconnect and the front electrodes of the first photovoltaic cell. The method further includes the step of attaching a second photovoltaic cell to overlay with the second contact region of the conductive interconnect, where a plurality of back vias of the second photovoltaic cell are electrically coupled between the second contact region of the conductive interconnect and the back electrodes of the second photovoltaic cell.

BRIEF DESCRIPTION OF THE DRAWINGS

Embodiments of the present invention will be better understood from a reading of the following detailed description, taken in conjunction with the accompanying drawing figures in which like reference characters designate like elements and in which.

DETAILED DESCRIPTION

Figure 1A:
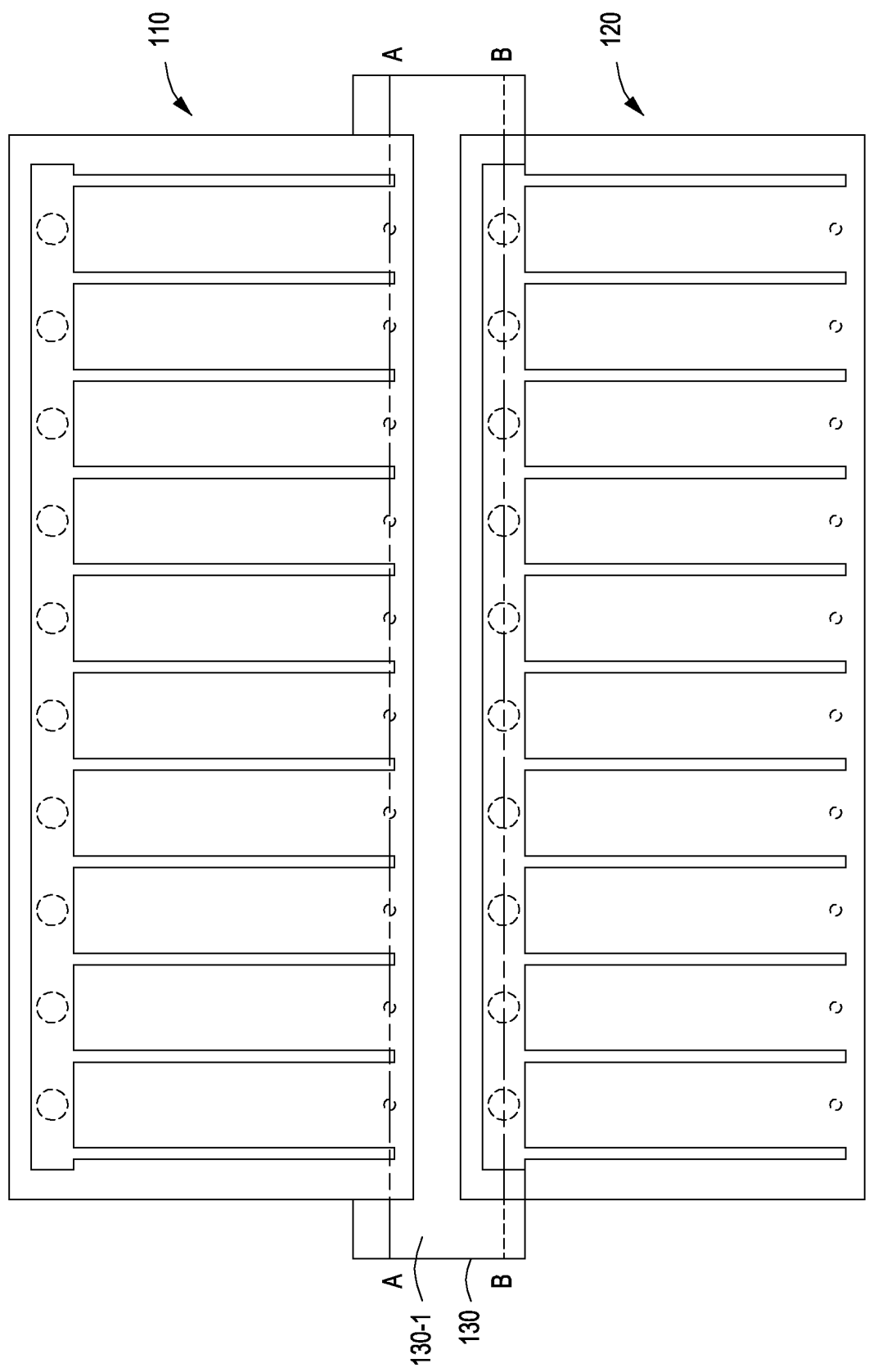
FIG. 1A is a plan view of the integration configuration of two exemplary photovoltaic cells each electrically coupled to a conductive interconnect through respective via structures in accordance with an embodiment of the present disclosure.

Reference will now be made in detail to the preferred embodiments of the present invention, examples of which are illustrated in the accompanying drawings. While the invention will be described in conjunction with the preferred embodiments, it will be understood that they are not intended to limit the invention to these embodiments. On the contrary, the invention is intended to cover alternatives, modifications and equivalents, which may be included within the spirit and scope of the invention as defined by the appended claims. Furthermore, in the following detailed description of embodiments of the present invention, numerous specific details are set forth in order to provide a thorough understanding of the present invention. However, it will be recognized by one of ordinary skill in the art that the present invention may be practiced without these specific details. In other instances, well-known methods, procedures, components, and circuits have not been described in detail so as not to unnecessarily obscure aspects of the embodiments of the present invention. Although a method may be depicted as a sequence of numbered steps for clarity, the numbering does not necessarily dictate the order of the steps. It should be understood that some of the steps may be skipped, performed in parallel, or performed without the requirement of maintaining a strict order of sequence. The drawings showing embodiments of the invention are semi-diagrammatic and not to scale and, particularly, some of the dimensions are for the clarity of presentation and are shown exaggerated in the drawing Figures. Similarly, although the views in the drawings for the ease of description generally show similar orientations, this depiction in the Figures is arbitrary for the most part. Generally, the invention can be operated in any orientation.

Notation and Nomenclature

It should be borne in mind, however, that all of these and similar terms are to be associated with the appropriate physical quantities and are merely convenient labels applied to these quantities. Unless specifically stated otherwise as apparent from the following discussions, it is appreciated that throughout the present invention, discussions utilizing terms such as "processing" or "accessing" or "executing" or "storing" or "rendering" or the like, refer to the action and processes of a computer system, or similar electronic computing device, that manipulates and transforms data represented as physical (electronic) quantities within the computer system's registers and memories and other computer readable media into other data similarly represented as physical quantities within the computer system memories or registers or other such information storage, transmission or display devices. When a component appears in several embodiments, the use of the same reference numeral signifies that the component is the same component as illustrated in the original embodiment.

Method for Interconnecting Solar Cells

Embodiments of the present invention are described within the context of interconnect solar cells into a solar module or a solar sub-module. Examples of such solar cells include but are not limited to photovoltaic devices, optoelectronic devices, semiconductor devices, and any electronic devices (e.g., diodes, light emitting diodes (LEDs), etc.). Examples of such metal contacts of an optoelectronic device include any pattern of electrodes of the optoelectronic device, including but not limited to finger bus bars configuration.

Herein, the terms "solar module," and "photovoltaic (PV) module" are used interchangeably; the terms "solar cell" and "PV cell" are used interchangeably. Herein, the terms "front" "back" "top" and "under" are used with reference to the intended orientation of a PV cell when it is installed in position for energy conversion. For example, the front side of the PV cell is intended to face sunlight.

The present disclosure is not limited to any specific configuration, structure, dimension, geometry, material composition, fabrication process or application of a solar cell. In some embodiments, the PV layer of the solar cell may include one or more thin film sub-layers based on GaAs, Copper Indium Gallium Selenide (CIGS), Cadmium Telluride (CdTe), amorphous Silicon, amorphous microcrystalline Tandem, thin-film polycrystalline Silicon, or etc. The substrate of the solar cell may be flexible or rigid and made of polymer, Silicon, glass, or etc. For example, the substrate is flexible and includes a pressure sensitive adhesive (PSA) layer and a polyethylene terephthalate (PET) layer.

In some embodiments, an array of PV cells are electrically coupled in series to achieve higher power generation, where a front electrode of a respective PV cell is connected with a back electrode of another PV cell for example. FIG. 1A is a plan view illustrating an integration configuration of two exemplary PV cells 110 and 120, each electrically coupled to a conductive interconnect 130 in accordance with an embodiment of the present disclosure. PV cell 110 and PV cell 120 each has a top surface and a back surface (not shown). The conductive interconnect 130 also has a top surface 130-1 and back surface (not shown). PV cells 110 and 120 are coupled to the top surface 130-1 of the conductive interconnect 130 at their back surfaces by overlapping partially with the interconnect 130. The electrical contact between the PV cell 110 and the interconnect 130 is provided by a conductive material dispensed in a plurality of back vias of the PV cell 110, the electrical contact between the PV cell 120 and the interconnect 130 is provided by a conductive material dispensed in a plurality of front vias of the PV cell 120.

Figure 1B:
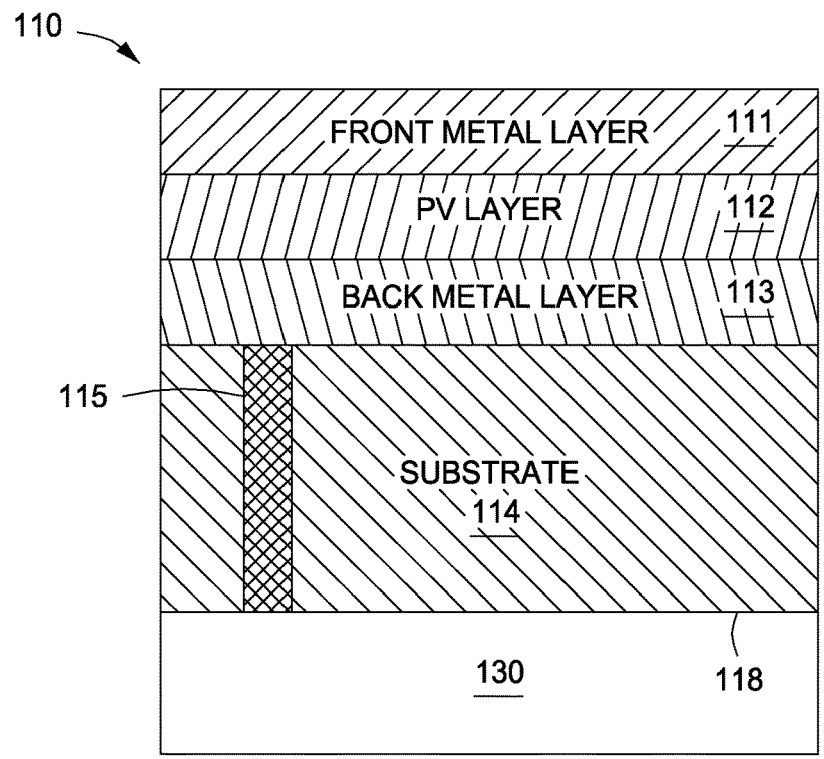
FIG. 1B is a cross section view of the integration configuration of FIG. 1A taken alone the line A-A.

FIG. 1B is a cross section view of the integration configuration of FIG. 1A taken along the line A-A. PV cell 110 includes a front metal layer 111, a PV layer 112, a back metal layer 113 and a nonconductive support substrate layer 114. PV cell 110 further includes a plurality of back vias 115 in the support substrate layer 114. A back via 115 extends through the substrate layer 114 and exposes a portion of the back metal layer 113 of the PV cell 110. Back vias 115 are dispensed with a conductive material which provides electrical connection between the back metal layer 113 of the PV cell 110 and the interconnect 130.

Figure 1C:
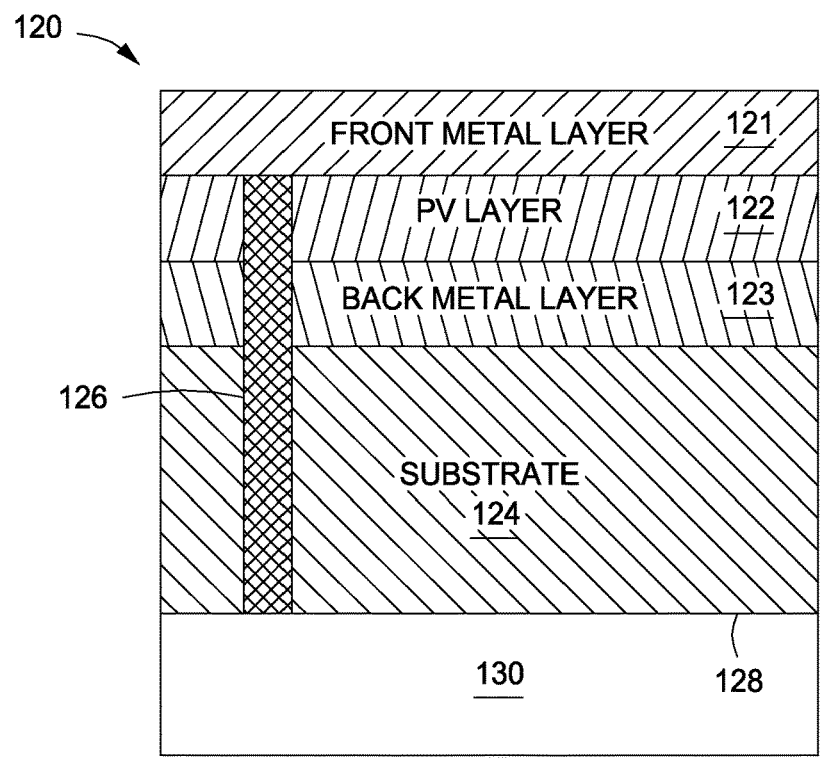
FIG. 1C is a cross section view of the integration configuration of FIG. 1A taken along the line B-B.

FIG. 1C is a cross section view of the integration configuration of FIG. 1A taken along the line B-B. PV cell 120 includes a front metal layer 121, a PV layer 122, a back metal layer 123 and a nonconductive support substrate layer 124. PV cell 120 further includes a plurality of front vias 126. A front via 126 extends in the stack of the substrate layer 124, the back metal layer 123 and the PV layer 122, and exposes a portion of the front metal layer 121 of the PV cell 120. Front vias 126 are dispensed with a conductive material which provides electrical connection between the front metal layer 121 of the PV cell 120 and the interconnect 130, thereby electrically interconnecting to the PV cell 110 in series. Front vias 126 are also dispensed with an insulation material (not shown) which electrically insulates the conductive material from any electrical contact with the back metal layer 123 and the PV layer 122.

Typically the conductive material is dispensed into the back via 115 from the back surface 118 of the substrate 114 after the back metal layer 113 has been integrated with the substrate 114. The conductive material and the insulation material which is around the wall of the front via 126 are also dispensed into the front via 126 from the back surface 128 of the substrate 124 after the back metal 123 has been integrated with the support substrate 124. To ensure a void-free electrical contact through the vias, it is practical to dispense an excessive amount of the conductive material into the vias. The conductive material can also be adhesive, coupling the PV cell 110 and the PV cell 120 to the interconnect 130.

It will be appreciated that each constituent layer of a PV cell as shown in FIG. 1 may have various suitable material compositions and may be fabricated or integrated in the PV cell in any suitable manner that is well known in the art. Also, the sequence of integrating the various constituent layers varies depending on the particular embodiment. The support substrate layer can also include one or more adhesive material layers that couple the support substrate to the back metal layer. For example, there can be a PSA layer bonding the substrate layer to the back metal layer.

Figure 2A:
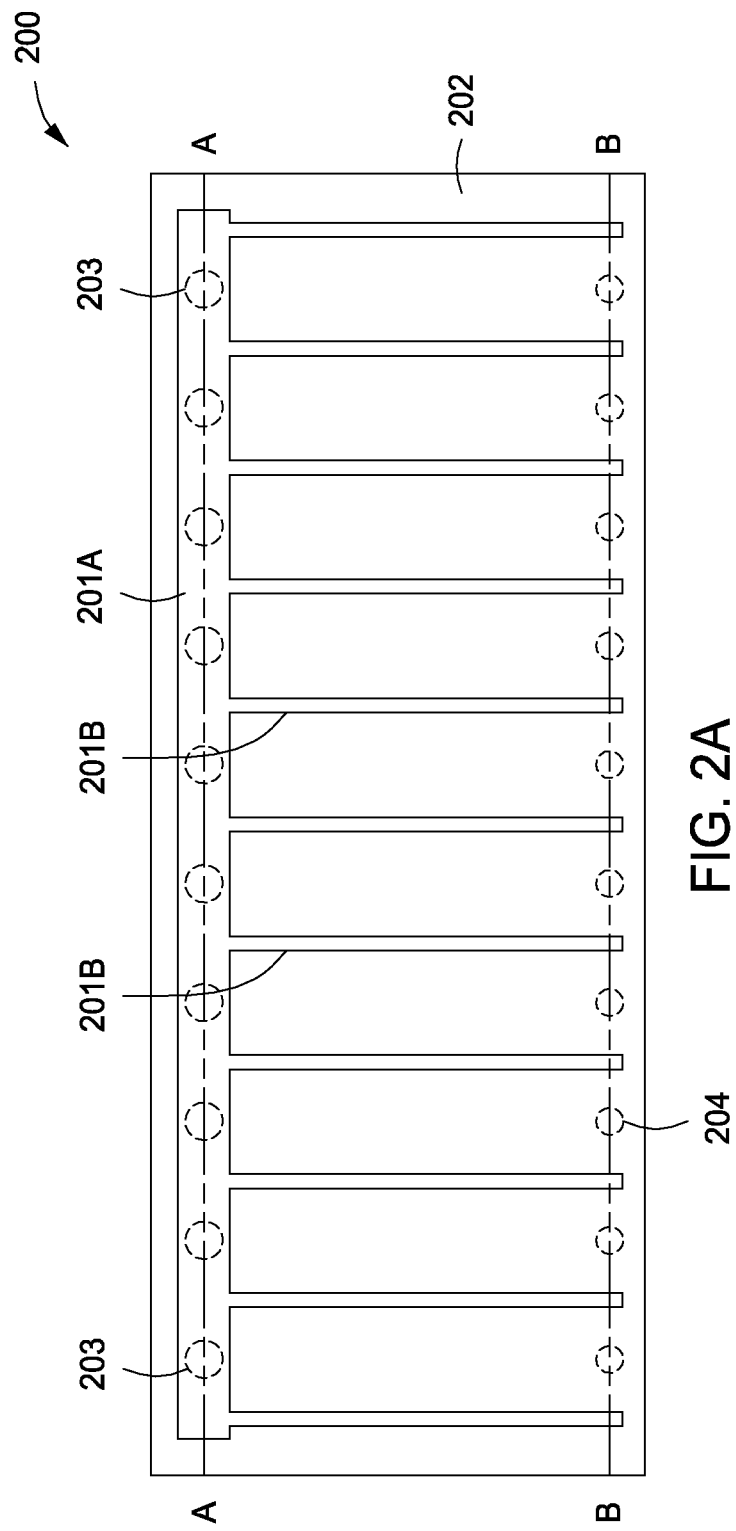
FIG. 2A is a plan view of an exemplary PV cell having a plurality of front vias and a plurality of back vias from the front surface of the PV cell in accordance with an embodiment of the present disclosure.

FIG. 2A is a plan view of an exemplary PV cell having a plurality of front vias and a plurality of back vias in accordance with an embodiment of the present disclosure. On a front surface 202 of the PV cell 200, comb-shaped front electrodes are shown to include a bus bar 201A and a plurality of fingers 201B. A plurality of front vias 203 are disposed underneath the bus bar 201A in lateral row and have a plurality of respective openings (shown in dotted circles) at the back surface (not shown) of the PV cell 200. A plurality of back vias 204 are disposed between the finger electrodes in a lateral row and have a plurality of respective openings (shown in dotted circle) at the back surface (not shown) of the PV cell 200.

Figure 2B:
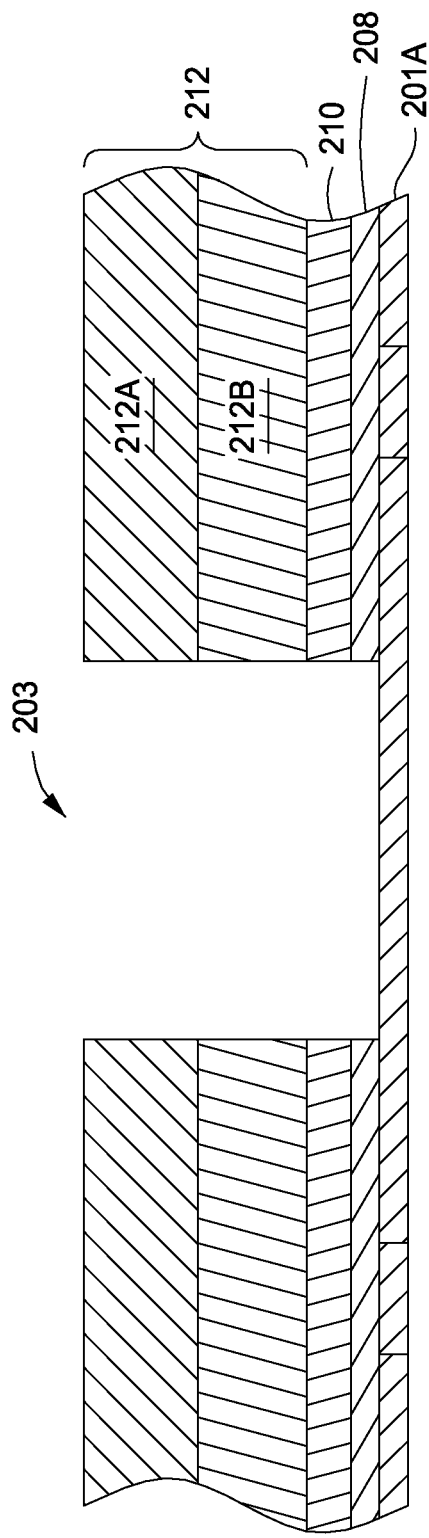
FIG. 2B is a cross section view of the PV cell of FIG. 2A taken along the line A-A.

FIG. 2B is a cross section view of a portion of the PV cell of FIG. 2A taken along the line A-A showing a front via structure. From back to front, the PV cell 200 includes a support substrate layer 212, a back metal layer 210, a PV layer 208 and a front metal layer 201A. The support substrate layer 212 is shown to include a PSA layer 212B and a PET layer 212A. The front via 203 extends through the stack of the support substrate layer 212, the back metal layer 210 and the PV layer 208 to expose a portion of the front electrodes. In this example, the front metal layer exposed is part of the bus bar 201A.

Figure 2C:
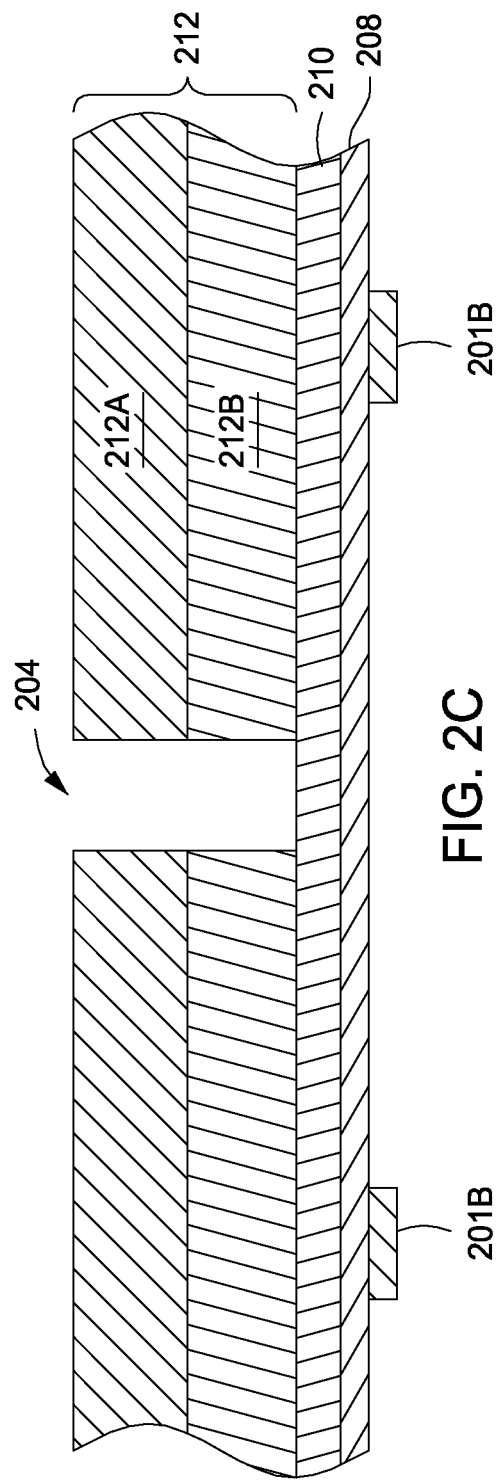
FIG. 2C is a cross section view of the PV cell of FIG. 2A taken along the line B-B.

FIG. 2C is a cross section view of a portion of the PV cell of FIG. 2A taken along the line B-B showing a back via structure. From back to front, the PV cell 200 includes a support substrate layer 212, a back metal layer 210, a PV layer 208 and a front metal layer 201B. The support substrate layer 212 is shown to include a PSA layer 212B and a PET layer 212A. The back via 204 extends through the support substrate layer 212 to expose a portion of the back metal layer 210.

A back via 204 can be formed by drilling through the support substrate layer 212 by laser ablation or any suitable techniques known in the art. A front via 203 can be formed by drilling through the support substrate layer 212 by laser ablation and followed by wet etching to extend through the back metal layer 210 and the PV layer 208, or any suitable techniques known in the art. In some embodiments, a laser can be used to ablate through the support substrate layer 212 and portions of the back metal layer 210. Then wet etching can be used to remove any remaining back metal layer 210 and to extend through the PV layer 208. The shapes, dimensions, patterns and number of the front vias and back vias illustrated herein are only exemplary.

Figure 3A:
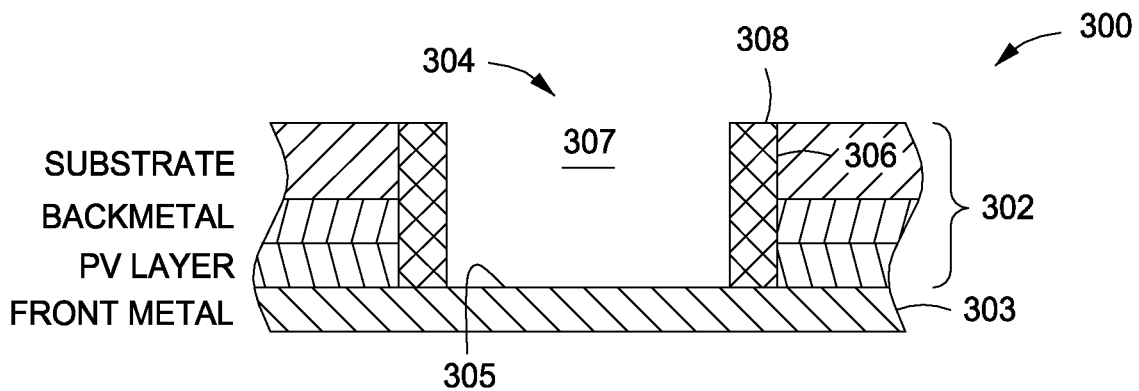
FIG. 3A is a cross section view of a portion of an exemplary PV cell showing a front via insulated with an insulation material in accordance with an embodiment of the present disclosure.

FIG. 3A is a cross section view of an exemplary front via dispensed with an insulation material in accordance with an embodiment of the present disclosure. As shown here, a front via 304 of the PV cell 300 has an interior surface 306 surrounded by the stack 302 of the support substrate, the back metal layer and the PV layer of the PV cell 300. An insulation material is dispensed over the interior surface 306 such that an insulation wall 308 is formed covering the entire height of the stack 302 and a void 307 is formed inside the front via 304 enclosed by the insulation wall 308. The insulation wall 308 insulates the back metal layer and the P side of the PV layer from forming an electrical contact with a conductive contact inside the void 304. The thickness of the insulation wall 308 covers a portion of the front metal layer 303 exposed by the front via 304 but leaves a portion 305 of the exposed front metal layer 303 uncovered by the insulation material.

Figure 3B:
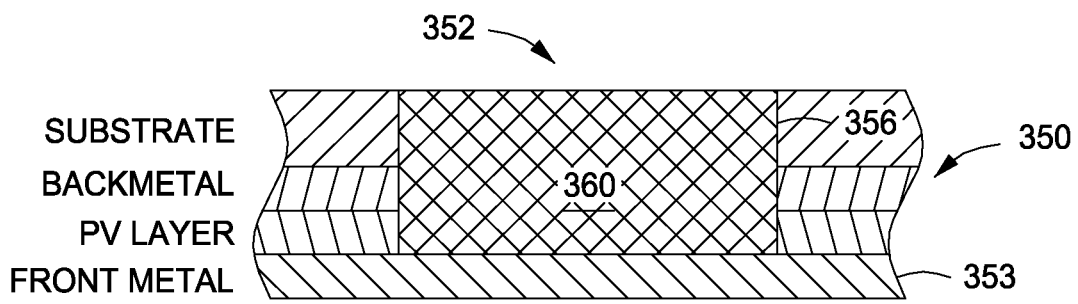
FIGS. 3B-3C illustrate cross section views of a portion of another exemplary PV cell showing a front via insulated with an insulation material in accordance with an embodiment of the present disclosure
Figure 3C:
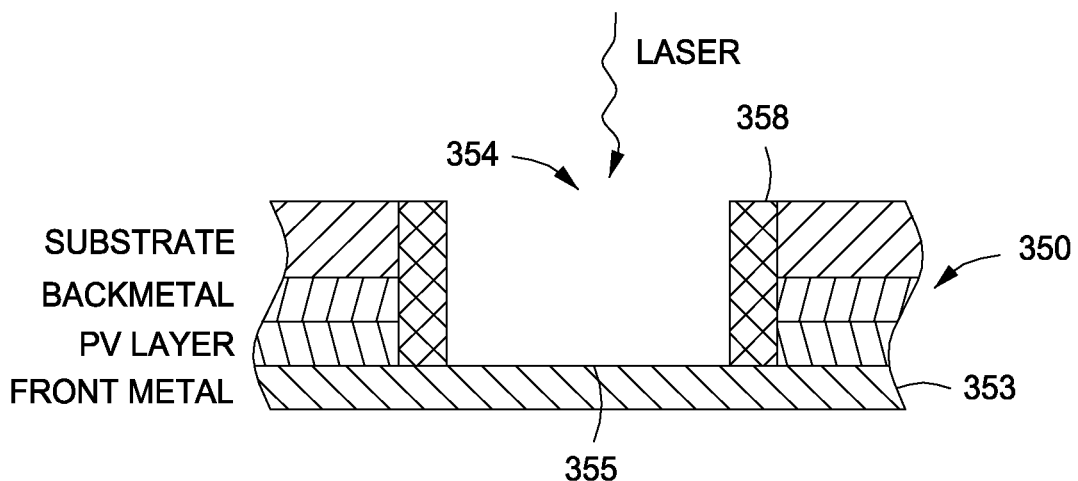

FIGS. 3B-3C are cross section views of an exemplary front via dispensed with an insulation material in accordance with another embodiment of the present disclosure. As shown in FIG. 3B, a front via 352 of a PV cell 350 is filled with an insulation material 360 such that the interior surface 356 of the front via 352 is covered by the insulation material 360. The insulation material 360 can cover a part or the entire portion of the front metal layer 353 exposed by the front via 352. A void 354 can be formed by, as shown in FIG. 3C, for example, ablating with a laser through the insulation material 360 to remove a center portion of the insulation material and to expose a portion 355 of the front metal layer 353. The remaining of the insulation material 360 forms an insulation wall 358 to prevent a conductive contact inside the void 354 from forming an electrical contact with the back metal layer and the P side of the PV layer of the PV cell 350.

Figure 4A:
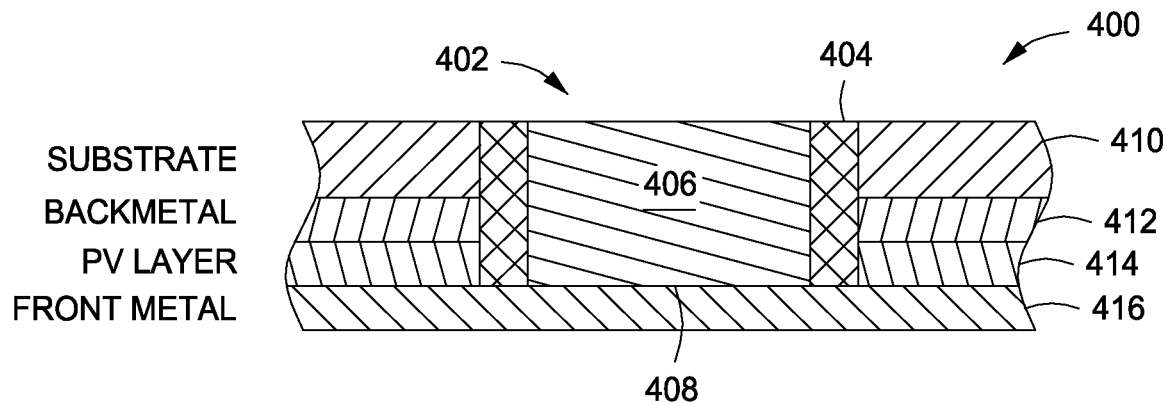
FIG. 4A is a cross section view of a portion of an exemplary PV cell showing an insulated front via dispensed with a conductive material in accordance with an embodiment of the present disclosure.

FIG. 4A is a cross section view of an exemplary front via dispensed with a conductive material after being insulated as shown in FIGS. 3A-3C in accordance with an embodiment of the present disclosure. The PV cell 400 includes a substrate layer 410, a back metal layer 412, a PV layer 414 and a front metal 416. A conductive material 406 is dispensed inside the insulation wall 404 of the front via 402 of the PV cell 400 and is in electrical contact with the front metal layer 416 at the portion 408. The conductive material 406 provides an electrical connection between the front metal layer 416 at one end and a conductive contact (not shown) at the other end towards the substrate layer 410.

Figure 4B:
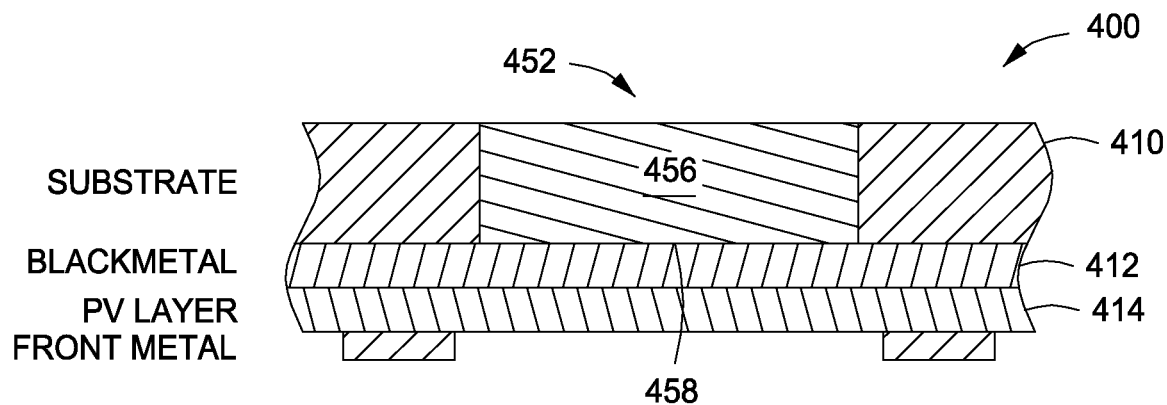
FIG. 4B is a cross section view of a portion of an exemplary PV cell showing a back via dispensed with a conductive material in accordance with an embodiment of the present disclosure.

FIG. 4B is a cross section view of an exemplary back via as shown in FIG. 2C dispensed with a conductive material in accordance with an embodiment of the present disclosure. A conductive material 456 is dispensed inside the back via 452 of the PV cell 400 and is in electrical contact with the back metal layer 412 at the portion 458. The conductive material 456 provides an electrical connection between the back metal layer 412 at one end and a conductive contact (not shown) at the other end towards the substrate layer 410. The conductive materials 406 and 456 can be same or different material. The conductive materials can be dispensed into the back vias and front vias by injection, deposition, evaporation or any other suitable dispensing process known in the art.

Figure 5:
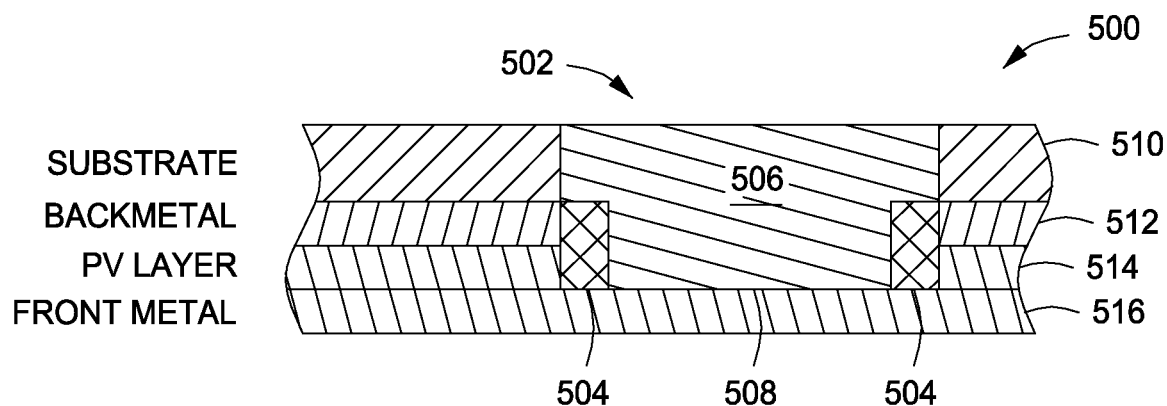
FIG. 5 is a cross section view of a portion of exemplary PV cell showing a differently insulated front via dispensed with a conductive material in accordance with an embodiment of the present disclosure.

FIG. 5 is a cross section view of an exemplary front via dispensed with a conductive material and insulated with an insulation material in accordance with an embodiment of the present disclosure. Because the insulation material insulates the conductive material dispensed inside the front via from an electrical contact with the back metal layer and the P side of the PV layer, and the support substrate layer are made of non-conductive materials, the conductive material dispensed inside the front via can be in contact with the support substrate layer as long as it is insulated from the back metal layer and the P side of the PV layer. As shown in FIG. 5, a front via 502 of a PV cell 500 has an insulation wall 504 extending through the PV layer 514 and past the back metal layer 512 into the substrate layer 510. In this example, the insulation wall 504 does not extend the entire stack of the PV layer 514, the back metal layer 512 and the support substrate layer 510, only covering the stack of PV layer 514 and the back metal layer 512, alternatively a portion of the supporter substrate layer 510. The conductive material 506 is dispensed inside the front via 502 insulated by the insulation wall 504 and in electrical contact with the front metal layer 516 at the portion 508. The conductive material 506 provides an electrical connection between the front metal layer 516 at one end and a conductive contact (not shown) at the other end towards the substrate layer 510.

It will be appreciated that the sizes and aspect ratios of the thickness of the layers, the front vias and the back vias are determined based on the configuration of the solar cell as well as the interconnect process needs. For instance, the substrate has a thickness of about 100 μm; the back metal layer has a thickness ranges from about 3 μm to 20 μm; the PV layer has a thickness ranges from about 2 μm to about 5 μm; the diameter of the back via ranges from about 300 μm to about 400 μm; and the diameter of the front vias is about 1 mm or less depending on the needs.

However, the present disclosure is not limited by the material composition, configuration and arrangement of the front electrodes or the back electrodes of each PV cells. For instance, the front electrode is made of a metal strip, e.g., composed primarily of Cu and about 5 μm thick. The PV layer includes a single layer or a stack of thin films, typically with a total thickness much less than 10 μm.

In some embodiments, the conductive material is a conductive adhesive used to provide electrical contact and/or mechanical bonding between a PV cell and a conductive interconnect. The conductive material can be in the form of ink, paste or resin and may be composed of Ag-epoxy. However, the present disclosure is not limited to any specific composition of the material dispensed in the front vias and the back vias.

In some embodiments, the insulation material is a PSA or Ethylene Vinyl Acetate (EVA). For example, the PSA can be heated into a liquid state and then dispensed against the interior side wall of a front via to form an insulation wall and to leave a void inside the insulation wall. The liquid PSA can also be dispensed in the entire space of a front via such that the interior side wall of the front via is covered. The PSA can be hardened by a cure process using UV light or heat.

Figure 6:
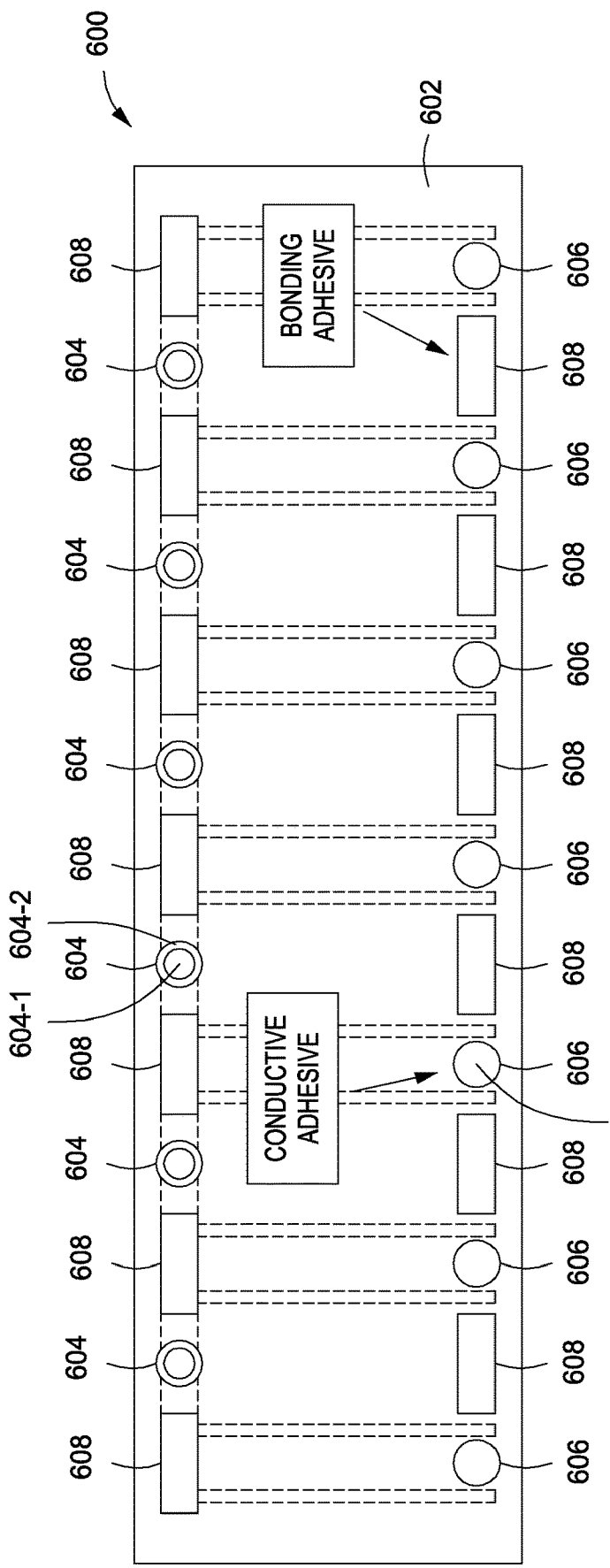
FIG. 6 is a plan view from the back surface of a PV cell showing a plurality of front vias and a plurality of back vias in accordance with an embodiment of the present disclosure.

FIG. 6 is a plan view from the back surface 602 of an exemplary PV cell 600 having a plurality of front vias and the plurality of back vias. The bus bar and the plurality of fingers disposed on the opposite side of the PV cell 600 are shown in dotted lines. A front via 604 has a circular shape and includes an inner conductive material 604-1 surrounded by an insulation wall 604-2. A plurality of bonding adhesive regions 608 can be configured between the plurality of front vias 604 in order to bond the PV cell 600 to an external interconnect (not shown) at the back surface 602. A back via 606 also has a circular shape and includes a conductive material 606-1 dispensed inside thereof. A plurality of bonding adhesives regions 608 can also be configured between the plurality of back vias 606 in order to bond the PV cell 600 to an external interconnect (not shown) at the back surface 602.

The conductive material dispensed inside the front vias 604 and back vias 606 can be conductive adhesives such that it not only electrically connects the PV cell 600 to another conductive contact but also mechanically couples the PV cell 600 to the conductive contact. In some embodiments, some of the front vias 604 and back vias 606 can be dispensed with bonding adhesive material, which may be nonconductive and mainly used for providing inter-cell mechanical bonding. In some other embodiments, some of the front vias and back vias for containing the bonding adhesives may not need to extend to the front metal layer or to the back metal layer. The shapes, sizes, patterns and numbers of the front vias, back vias, bonding adhesive regions, bus bar and conductive fingers are merely exemplary and can be configured in any shape, size, pattern or number that is suitable for interconnecting PV cells at the back surfaces.

Figure 7A:
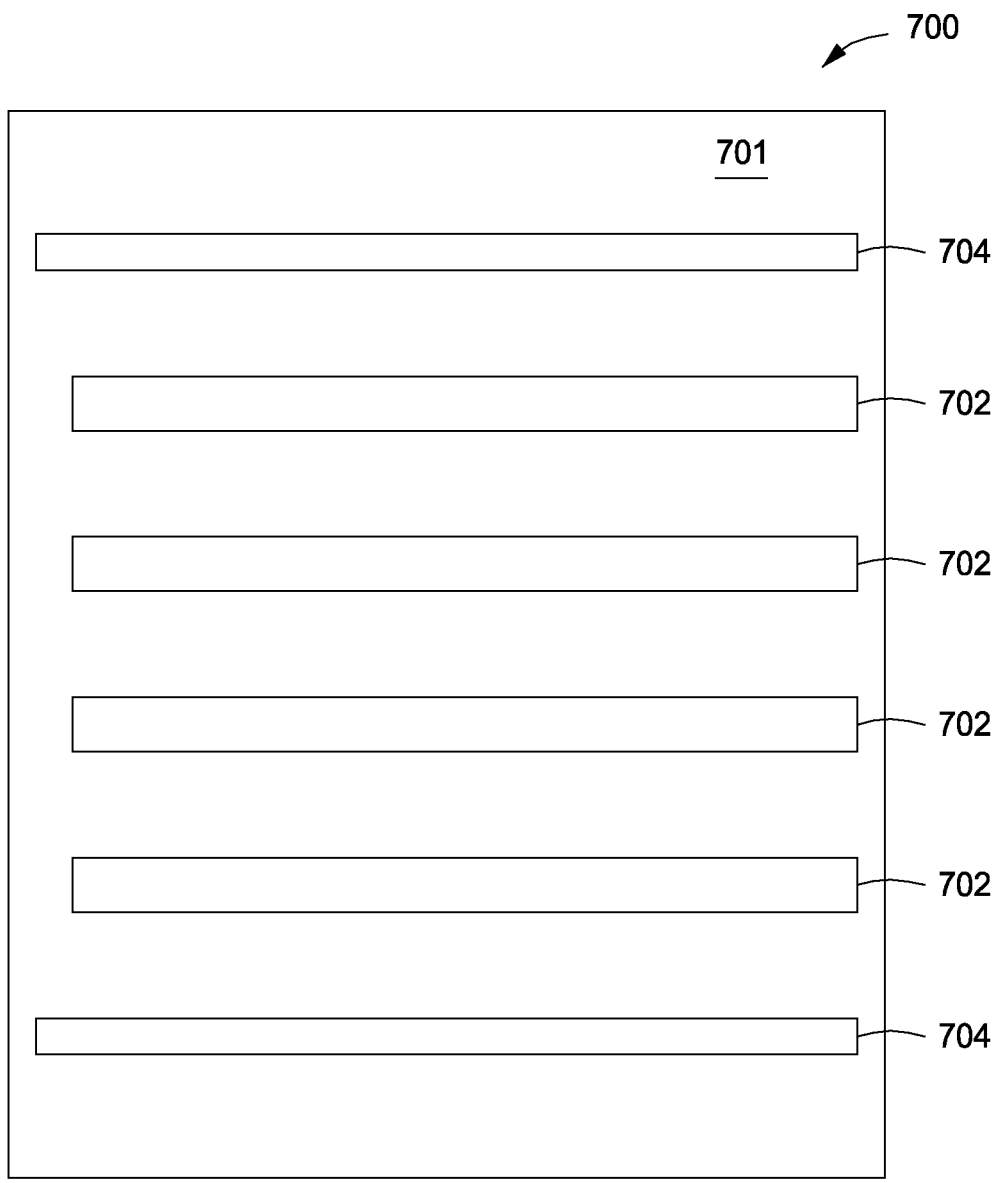
FIG. 7A is a plan view of a back substrate showing a plurality of conductive interconnects in accordance with an embodiment of the present disclosure.

FIG. 7A is a plan view of a back substrate showing a plurality of interconnects in accordance with an embodiment of the present disclosure. The back substrate 700 has a front surface 701 for housing a plurality of PV cells interconnected into a PV module. A plurality of conductive interconnects 702 are disposed on the surface 701. At the upper side and bottom side of the back substrate 700, connectors 704 can be disposed as end connectors for the entire PV module. Alternatively, interconnect 704 can also be configured as the end connector of the PV module.

Figure 7B:
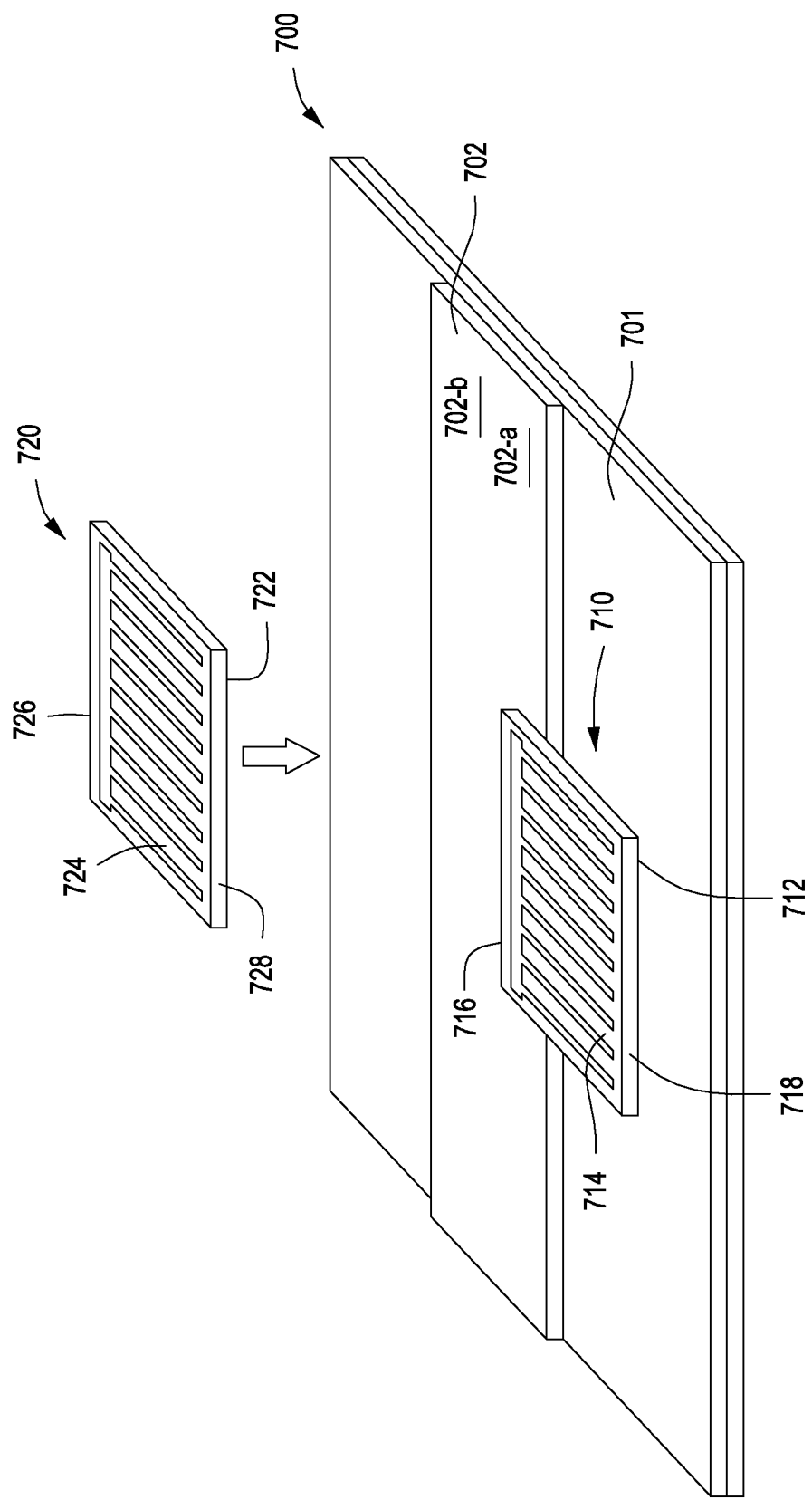
FIG. 7B illustrates a first and second PV cells being coupled to a conductive interconnect on top of the back substrate of FIG. 7A in accordance with an embodiment of the present disclosure.

FIG. 7B illustrates a first PV cell 710 coupled to a conductive interconnect to a second PV cell 720 on the surface 701 of the back substrate 700 in accordance with an embodiment of the present disclosure. The interconnect 702 has a first contact region 702-a at its lower portion and a second contact region 702-b at its upper portion. The first PV cell 710 has a front surface 714 and a back surface 712, a top side 716 and a bottom side 718. The back surface 712 houses the plurality of openings of a plurality of front vias (not shown) and a plurality of back vias (not shown). The top side 716 is the side where the bus bar is disposed on the front surface 714 and the corresponding front vias are configured underneath the bus bar. The bottom side 718 is the side where the plurality of back vias are configured.

The second PV cell 720 can have the same structure of the first PV cell, i.e., the second PV cell 720 can have a front surface 724, a back surface 722, a top side 726 and a bottom side 728. The back surface 722 houses the plurality of openings of a plurality of front vias (not shown) and a plurality of back vias (not shown). The top side 726 is the side where the bus bar is disposed on the front surface 724 and the corresponding front vias are configured underneath the bus bar. The bottom side 728 is the side where the plurality of back vias are configured.

As shown in FIG. 7B, the first PV cell 710, disposed on top of the surface 701 of the back substrate 700 on the back surface 712 of the PV cell 710, is oriented such that it overlays partially with the interconnect 702 at the top side 716 on top of the first contact region 702-a of the interconnect 702. A second PV cell 720 is shown to be disposed on top of the surface 701 of the back substrate 700 and the back surface 722 of the PV cell 720. The second PV cell 720 is oriented such that it overlays partially with the interconnect 702 at the bottom side 728 on top of the second contact region 702-b of the interconnect 702.

Upon contact, the conductive material dispensed in the plurality of front vias form an electrical connection between the front metal (not shown) of the first PV cell 710 and the first contact region 702-a of the conductive interconnect 702. Upon contact, the conductive material dispensed in the plurality of back vias form an electrical connection between the back metal (not shown) of the second PV cell 720 and the second contact region 702-b of the conductive interconnect 702. Therefore, the front metal of the first PV cell 710 is electrically coupled to the back metal of the second PV cell 720 through the conductive interconnect 702, achieving a serial connection between the first PV cell 710 and the second PV cell 720

The interconnect 702 can be any conductive material that is suitable for connecting PV cells. For example, the interconnect 702 can be made of Cu, Au, Al, or compound metal. In some embodiments, strips of interconnect 702 can be coupled to the surface 701 of the back substrate 700 by bonding adhesives such as TPU. In other embodiments, interconnect 702 can be formed by the application of conductive paste of Cu, Au, Al or compound material thereof on top of the surface 701 of the back substrate 700. Typically, an interconnect has a thickness of about 20 μm.

The back substrate 700 can be any material that is suitable for providing a support for a PV module. The back substrate 700 can also be a thermal plastic or composite plastic such that the plurality of PV cells of a PV module are mechanically bonded to the surface of the back substrate. For example, the back substrate 700 can be manufactured from PVB, PVE or PE, or any suitable materials known in the art.

Figure 7D:
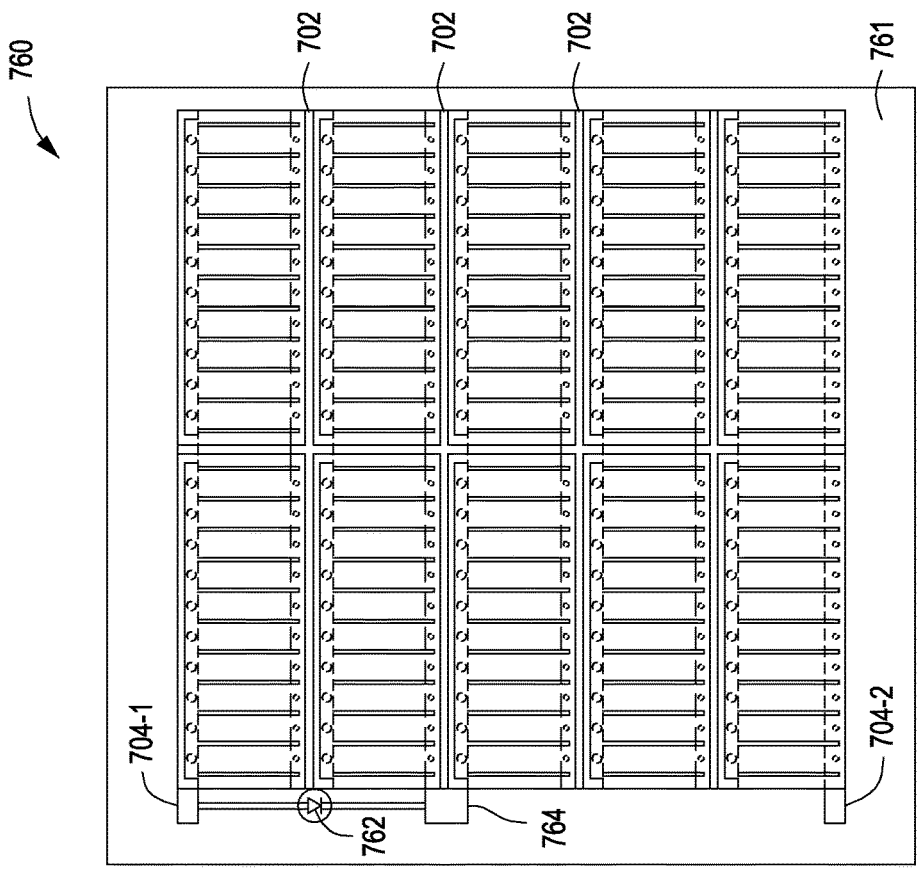
FIG. 7D is a plan view of an exemplary PV module showing a diode electrically coupled to an interconnect extension in accordance with an embodiment of the present disclosure.
Figure 7C:
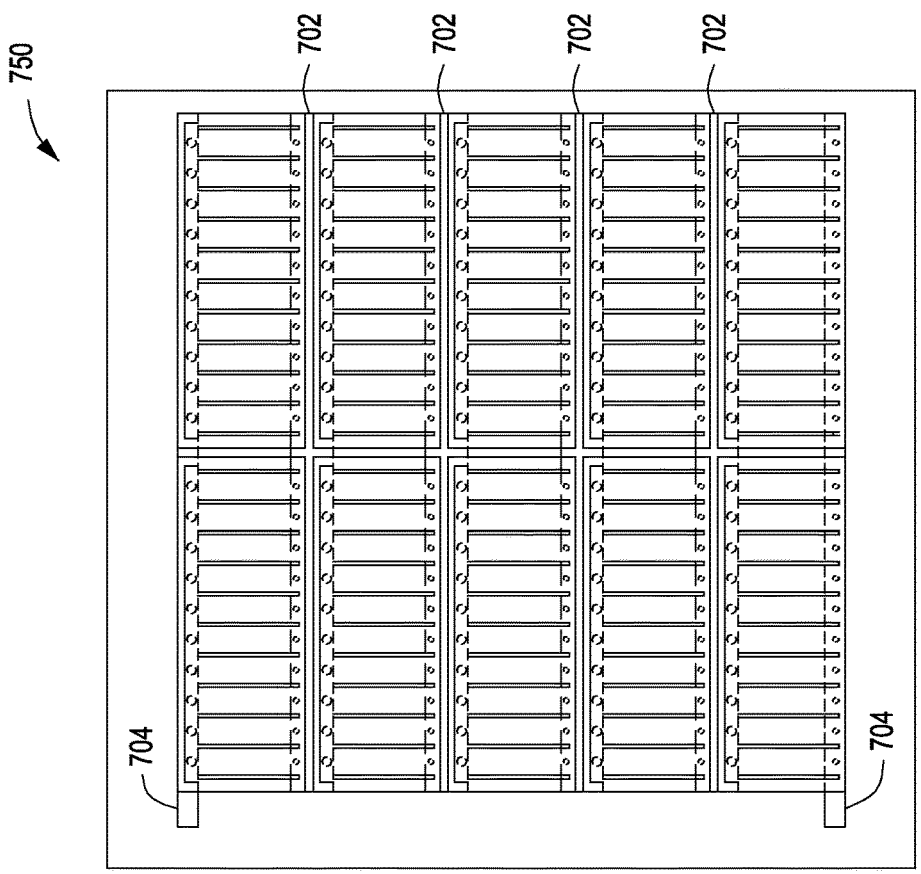
FIG. 7C is a plan view of an exemplary PV module showing a plurality of PV cells interconnected by the plurality of conductive interconnects of FIG. 7A in accordance with an embodiment of the present disclosure.

FIG. 7C is a plan view of an exemplary PV module formed by a plurality of PV cells interconnected by a plurality of conductive interconnects in accordance with an embodiment of the present disclosure. In this exemplary PV module 750, along the horizontal direction, the first contact region and the second contact region of a conductive interconnect 702 are each overlaid with two PV cells in the same orientation. Along the vertical direction, a PV cell is connected to two interconnects at its respective top side (front via side) and bottom side (back via side). In this example, two connectors 704 are each disposed as the p-contact connector and the n-contact connector of the PV module 750. The connector 704 is half the width of the interconnect 702 because the connector 704 is coupled to PV cells only at one contact region at the border of the PV module.

FIG. 7D is a plan view of an exemplary PV module having a diode electrically coupled to a PV module in accordance with an embodiment of the present disclosure. In this example, an interconnect 702 of the PV module 760 is shown to have an extension tab 764 for electrical connecting one terminal end (n-type end) of a diode 762 to the interconnect 702. The other terminal end (p-type end) of the diode 762 is electrically connected to the connector 704-1 at the top side of the PV module 760. The diode 762 conducts current when one or more PV cells connected between the connector 704-1 and the interconnect 702 becomes reverse biased due to the effects of shading or other mismatches. The diode 762 can be coupled in electrically with the extension tab 764 and connector 704-1 by soldering or conductive adhesives, or intermediary conductive strips or materials electrically coupling the extension tab 764 to the diode and the diode to the connector 704-1, or by any suitable techniques known in the art. The extension tab 764 can be coupled to the surface 761 of the back substrate of the PV module 760 in the same ways the conductive interconnects are coupled to the back substrate. The number of extension tabs and diodes can be configured in any number suitable for protecting PV cells from shading damage.

Although FIG. 7D illustrates a PV module with PV cells connected in series to provide a desired voltage between the connector 704-1 and connector 704-2, the interconnect 702 can also provide for PV cells to form connection in parallel to provide a desired current, or in a series-parallel combination. The shape, relative size, and number of conductive interconnects configured for a PV module on top of a back substrate can be any shape, size or number that is suitable for assembling a PV module. Further, because the p-contact and n-contacts of a PV cell to external circuits are both at the back side, i.e., the non-incident light side, of a PV cell, a larger degree of the tolerance of a larger overlapping region between a PV cell and a contact region of an interconnect can be achieved. The larger the overlapping region, the thinner the interconnect can be and the higher the degree of shift tolerance in terms of disposing PV cells onto the conductive interconnect.

Although certain preferred embodiments and methods have been disclosed herein, it will be apparent from the foregoing disclosure to those skilled in the art that variations and modifications of such embodiments and methods may be made without departing from the spirit and scope of the invention. It is intended that the invention shall be limited only to the extent required by the appended claims and the rules and principles of applicable law.

What is claimed is:

1. A photovoltaic module comprising:
a back substrate;
a plurality of conductive interconnects separately formed from the back substrate and each having a back surface physically attached on to a top of a surface of the back substrate, the conductive interconnects being parallel to each other and separated from each other so as to form multiple parallel rows of conductive interconnects arranged from a top side of the back substrate to a bottom side of the back substrate, each of the plurality of conductive interconnects comprises a first contact region on one side along a length and on a top surface of a conductive interconnect and a second contact region on an opposite side along the length and on the top surface of the conductive interconnect; and
a plurality of photovoltaic cells separately formed from the plurality of conductive interconnects and electrically coupled to each other when placed in physical contact with the plurality of conductive interconnects so as to form multiple parallel rows of photovoltaic cells also arranged from the top side of the back substrate to the bottom side of the back substrate, wherein a respective photovoltaic cell comprises a front metal layer disposed on a front surface of a photovoltaic layer disposed on top of a back metal layer disposed on top of a support substrate, wherein a plurality of back vias extend from openings in a back surface of the photovoltaic cell through the support substrate forming an electrical contact with the back metal layer, wherein a plurality of front vias extend from openings on the back surface of the photovoltaic cell through the support substrate, the back metal layer, and the photovoltaic layer, and wherein the plurality of front vias form an electrical contact with the front metal layer and are insulated from making an electrical contact with the back metal layer and the photovoltaic layer;
wherein for at least some of the plurality of photovoltaic cells, each photovoltaic cell has a first portion of the back surface disposed in direct physical contact with the first contact region of one of the plurality of conductive interconnects thereby partially overlapping the one conductive interconnect, and has a second portion of the back surface disposed in direct physical contact with the second contact region of an adjacent one of the plurality of conductive interconnects thereby partially overlapping the adjacent conductive interconnect, and for a first photovoltaic cell of the at least some of the plurality of photovoltaic cells, the first contact region of the one conductive interconnect is electrically coupled to the plurality of front vias of the first photovoltaic cell and the second contact region of the adjacent conductive interconnect is electrically coupled to the plurality of back vias of the first photovoltaic cell, and
wherein the front metal layer forms comb-shaped front electrodes that include a bus bar and finger electrodes, the plurality of front vias aligned with a length of the bus bar and the plurality of back vias disposed in spaces between the finger electrodes and aligned with the plurality of front vias.

2. The photovoltaic module of claim 1, wherein the first contact region of the one conductive interconnect is electrically coupled to the plurality of front vias of the first photovoltaic cell by a conductive material dispensed in the plurality of front vias.

3. The photovoltaic module of claim 1, wherein the second contact region of the adjacent conductive interconnect is electrically coupled to the plurality of back vias of the first photovoltaic cells by a conductive material dispensed in the plurality of back vias.

4. The photovoltaic module of claim 1, wherein a front via of the plurality of front vias is formed by laser ablation through the support substrate to the back metal layer and wet etching through the photovoltaic layer.

5. The photovoltaic module of claim 1, wherein an insulation material is dispensed on a side wall of the photovoltaic layer, the back metal layer, and the support substrate of a front via of a photovoltaic cell of the plurality of the photovoltaic cells to form an insulation wall, and a conductive material is dispensed within the space formed by the insulation wall.

6. The photovoltaic module of claim 5, wherein the insulation wall covers the side wall of the front via in regions of the photovoltaic layer and the back metal layer.

7. The photovoltaic module of claim 1, wherein a conductive interconnect of the plurality of conductive interconnects comprises an extension electrically coupled to a diode.

8. The photovoltaic module of claim 1, wherein the back substrate is a thermal plastic which bonds the plurality of photovoltaic cells to the surface of the back substrate.

9. A method for interconnecting separately formed photovoltaic cells, the photovoltaic cells comprising a front metal layer disposed on a front surface of a photovoltaic layer disposed on top of a back metal layer disposed on top of a support substrate, wherein a plurality of back vias extend from openings on a back surface of the photovoltaic cell through the support substrate forming an electrical contact with the back metal layer, and a plurality of front vias extend from openings on the back surface of the photovoltaic cell through the support substrate, the back metal layer, and the photovoltaic layer, and wherein the plurality of front vias form an electrical contact with the front metal layer and are insulated from making an electrical contact with the back metal layer and the photovoltaic layer, the method comprising the steps of:

attaching a back surface of each of a plurality of conductive interconnects formed separately from a back substrate to a top surface of the back substrate, the conductive interconnects being parallel to each other and separated from each other so as to form multiple parallel rows of conductive interconnects arranged from a top side of the back substrate to a bottom side of the back substrate, each of the plurality of conductive interconnects comprises a first contact region on one side along a length and on a top surface of a conductive interconnect and a second contact region on an opposite side along the length and on the top surface of the conductive interconnect;

attaching a first photovoltaic cell to partially overlap with the first contact region of one conductive interconnect of the plurality of conductive interconnects, such that a first portion of a back surface of the first photovoltaic cell is disposed in direct physical contact with said surface of the back substrate and a second portion of the back surface of the first photovoltaic cell is disposed in direct physical contact with the first contact region of the one conductive interconnect, wherein a plurality of front vias of the first photovoltaic cell are electrically coupled between the first contact region of the one conductive interconnect and the front metal layer of the first photovoltaic cell; and attaching a second photovoltaic cell to partially overlap with the second contact region of the one conductive interconnect, such that a first portion of a back surface of the second photovoltaic cell is disposed in direct physical contact with the surface of the back substrate and a second portion of the back surface of the second photovoltaic cell is disposed in direct physical contact with the second contact region of the one conductive interconnect, wherein a plurality of back vias of the second photovoltaic cell are electrically coupled between the second contact region of the one conductive interconnect and the back metal layer of the second photovoltaic cell, wherein the first photovoltaic cell and the second photovoltaic cell are formed separately from the plurality of conductive interconnects and are subsequently attached to the plurality of conductive interconnects so as to form multiple parallel rows of photovoltaic cells also arranged from the top side of the back substrate to the bottom side of the back substrate, and wherein the front metal layer forms comb-shaped front electrodes that include a bus bar and finger electrodes, the plurality of front vias aligned with a length of the bus bar and the plurality of back vias disposed in spaces between the finger electrodes and aligned with the plurality of front vias.

10. The method of claim 9, wherein the first contact region of the one conductive interconnect is electrically coupled to the plurality of front vias of the first photovoltaic cell by a conductive material dispensed in the plurality of front vias.

11. The method of claim 9, wherein the second contact region of the one conductive interconnect is electrically coupled to the plurality of back vias of the second photovoltaic cell by a conductive material dispensed in the plurality of back vias.

12. The method of claim 9, wherein a front via is formed by laser ablation through the support substrate to the back metal layer and wet etching through the photovoltaic layer.

13. The method of claim 9, wherein an insulation material is dispensed on a side wall of the photovoltaic layer, the back metal layer, and the support substrate layer of a front via to form an insulation wall, and a conductive material dispensed within the space formed by the insulation wall.

14. The method of claim 13, wherein the insulation wall covers the side wall of the front via in regions of the photovoltaic layer and the back metal layer.

15. The method of claim 9, further comprising forming an extension of a conductive interconnect of the plurality of conductive interconnects and electrically coupling a diode to the extension.

16. The method of claim 9, wherein the back substrate is a thermal plastic which bonds the plurality of photovoltaic cells to the surface of the back substrate.

17. The photovoltaic module of claim 1, wherein:
the plurality of conductive interconnects includes at least a first conductive interconnect, a second conductive interconnect, and a third conductive interconnect,
the second conductive interconnect is positioned between the first conductive interconnect and the third conductive interconnect,
the first contact region of the second conductive interconnect is positioned closer to the second contact region of the first conductive interconnect than the first contact region of the first conductive interconnect, and
the second contact region of the second conductive interconnect is positioned closer to the first contact region of the third conductive interconnect than the second contact region of the third conductive interconnect.

18. The method of claim 9, wherein:
the plurality of conductive interconnects includes at least a first conductive interconnect, a second conductive interconnect, and a third conductive interconnect,
the second conductive interconnect is positioned between the first conductive interconnect and the third conductive interconnect,
the first contact region of the second conductive interconnect is positioned closer to the second contact region of the first conductive interconnect than the first contact region of the first conductive interconnect, and
the second contact region of the second conductive interconnect is positioned closer to the first contact region of the third conductive interconnect than the second contact region of the third conductive interconnect.

* * * * *